United States Patent
Chau et al.

(10) Patent No.: US 7,246,282 B2
(45) Date of Patent: Jul. 17, 2007

(54) BYPASSING A DEVICE IN A SCAN CHAIN

(75) Inventors: Andrew Chau, Sacramento, CA (US); Nitin Bhagwath, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 390 days.

(21) Appl. No.: 10/607,159

(22) Filed: Jun. 25, 2003

(65) Prior Publication Data

US 2004/0268196 A1    Dec. 30, 2004

(51) Int. Cl.
*G01R 31/28* (2006.01)
*G06F 11/00* (2006.01)

(52) U.S. Cl. .................. 714/724; 714/726; 714/727; 714/14; 714/36

(58) Field of Classification Search ........... 714/726, 714/724
See application file for complete search history.

(56) References Cited

U.S. PATENT DOCUMENTS

| 4,675,673 | A | * | 6/1987 | Oliver | 324/761 |
|---|---|---|---|---|---|
| 5,459,737 | A | * | 10/1995 | Andrews | 714/733 |
| 5,477,545 | A | | 12/1995 | Huang | |
| 5,615,217 | A | | 3/1997 | Horne et al. | |
| 5,894,483 | A | | 4/1999 | Kaminski | |
| 6,073,260 | A | * | 6/2000 | Kurita | 714/724 |
| 6,662,316 | B1 | * | 12/2003 | Owhadi | 714/46 |
| 6,886,110 | B2 | * | 4/2005 | O'Brien | 714/34 |
| 2003/0079166 | A1 | | 4/2003 | Vermeulen et al. | |
| 2004/0004888 | A1 | * | 1/2004 | Sumita et al. | 365/222 |

FOREIGN PATENT DOCUMENTS

EP    0662616    7/1995

* cited by examiner

*Primary Examiner*—Phung My Chung

(57) ABSTRACT

Methods and systems for testing devices in a scan chain are described. A first device for test and a second device for test are coupled in the scan chain. A signal selector is coupled between the first and second devices. The signal selector selects between an output signal that is output from the first device and a bypass signal that has bypassed the first device.

15 Claims, 2 Drawing Sheets

BYPASSING A DEVICE IN A SCAN CHAIN

TECHNICAL FIELD

Embodiments of the present invention relate to testing of devices in a scan chain. More specifically, embodiments of the present invention relate to boundary scan testing.

BACKGROUND ART

With advances in design, device components are being placed closer together in smaller-sized packages. As a result, traditional techniques for testing devices can be difficult to implement.

The Joint Test Action Group (JTAG) was formed by manufacturers to address testing problems associated with smaller devices. The findings and recommendations of JTAG were used as the basis for the Institute of Electrical and Electronic Engineers (IEEE) Standard 1149.1, "Standard Test Access Port and Boundary-Scan Architecture." This standard is commonly referred to as JTAG. Boundary scan testing as defined by JTAG provides the ability to set and read values on device pins without direct physical access. According to JTAG, there are a number of registers associated with boundary scan testing. One of these registers is the Bypass register, which is a single-bit register that passes information from the "test data in" (TDI) to the "test data out" (TDO) pin. Devices under test can be can be coupled in series in what is referred to as a "scan chain." The Bypass register allows the testing of other devices in a scan chain without unnecessary overhead.

However, testing of devices coupled in a scan chain can be problematic when one of the devices is powered off or is inoperable for some reason. When this occurs, there is a break in the scan chain and test signals cannot be passed down the chain. Therefore, with conventional scan chain testing, the chain needs to be intact, with all devices in the chain powered on and operable. Conventionally, the testing is halted until the scan chain is again intact; that is, testing is not performed until the device that is powered off or inoperable is either powered on, returned to an operable state, or physically removed from the chain. As a consequence, testing is made more difficult, and the time needed for testing is increased. Accordingly, a system and/or method that can allow scan chain testing when one or more of the devices in the scan chain are powered off or otherwise inoperable would be valuable.

DISCLOSURE OF THE INVENTION

Embodiments of the present invention pertain to methods and systems for testing devices in a scan chain. In one embodiment, a first device for test and a second device for test are coupled in the scan chain. A signal selector is coupled between the first and second devices. The signal selector selects between an output signal that is output from the first device when the first device is powered on, operable and included in the scan chain, and a bypass signal that has bypassed the first device when the first device is powered off, deemed inoperable, or isolated from the scan chain.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Figure 1:
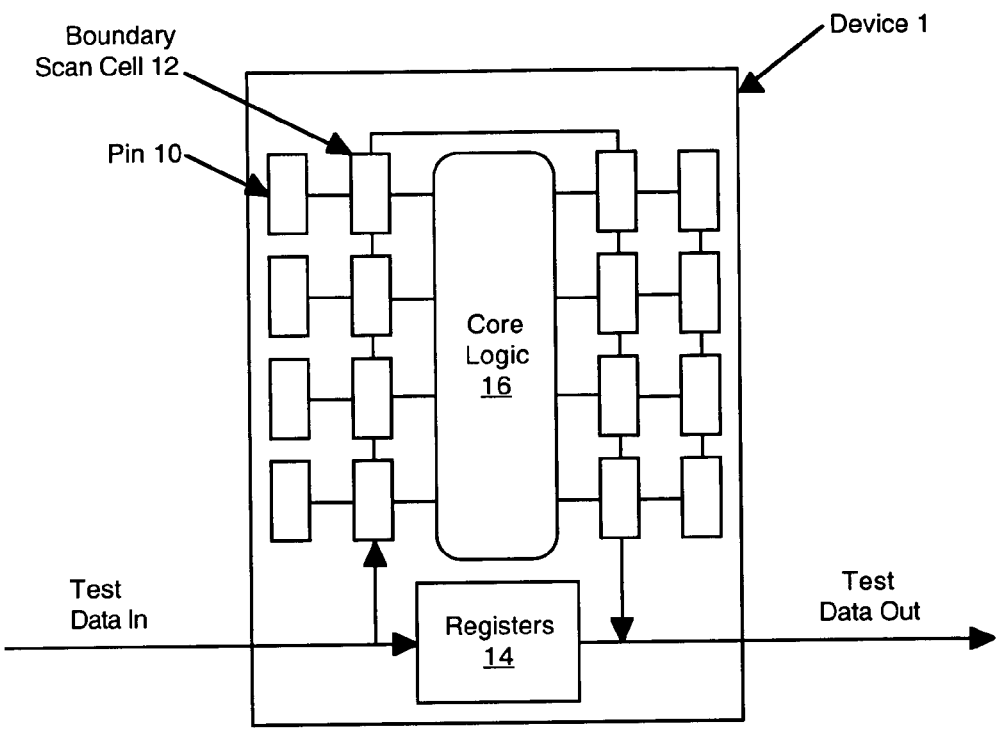
FIG. 1 is a block diagram of a boundary scan compliant device according to one embodiment of the present invention.

FIG. 1 is a block diagram of a boundary scan compliant device 1 according to one embodiment of the present invention. Specifically, device 1 is substantially compliant with the Institute of Electrical and Electronic Engineers (IEEE) Standard 1149.1, "Standard Test Access Port and Boundary-Scan Architecture." Device 1 can also be said to be substantially compliant with the recommendations of the Joint Test Action Group (JTAG). Accordingly, in the present embodiment, device 1 can utilize boundary scan testing.

Boundary scan compliant, JTAG compliant devices, and boundary scan testing are known in the art; nevertheless, a brief description is included herein. Boundary scan testing provides the capability to set and/or read values on pins (exemplified by pin 10) without direct physical access. Signals between core logic 16 of device 1 and the pins (e.g., pin 10) are intercepted by boundary scan cells (exemplified by boundary scan cell 12). During normal operation of device 1, the boundary scan cells are invisible. However, during testing, the boundary scan cells can be used to set and/or read values. These values can be the values of the pins or the values of the core logic 16, depending on the test mode.

The "test data in" (TDI) of FIG. 1 represents data shifted in the test or programming logic of device 1. The "test data out" (TDO) of FIG. 1 represents the data shifted out of the test or programming logic of device 1.

Registers 14 represent the collective set of registers used by a boundary scan compliant device. The registers 14 can include data registers and instruction registers. The registers 14 and the boundary scan cells (e.g., boundary scan cell 12) are part of the scan path. Signals between core logic 16 and the pins of device 1 are intercepted by the scan path during testing.

Figure 2A:
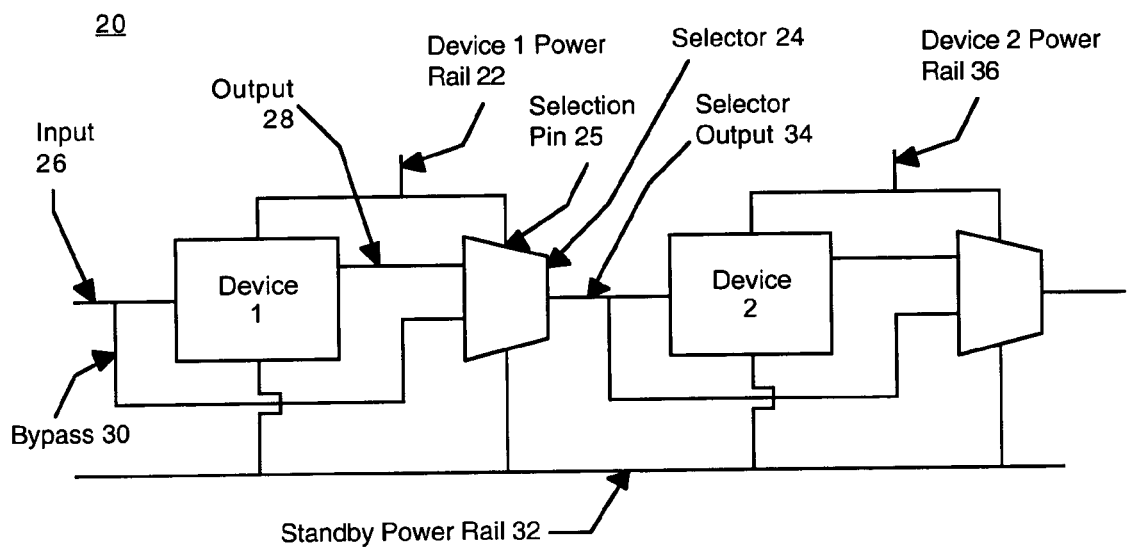
FIG. 2A is a block diagram of a system for testing devices according to one embodiment of the present invention.

FIG. 2A is a block diagram of a system 20 for testing devices according to one embodiment of the present invention. In the present embodiment, system 20 includes device 1 coupled to device 2 in a scan chain. Device 1 and device 2 are boundary scan compliant devices. Devices 1 and 2 can be, but are not limited to, integrated circuits, for example.

Coupled between device 1 and device 2 is a signal selector 24. In one embodiment, selector 24 is a multiplexer.

System 20 can include any number of devices coupled in a scan chain. Consecutive devices in the scan chain may or may not be coupled to an intervening signal selector. That is, a signal selector may or may not be coupled between two devices that are coupled in series in the scan chain. As will be seen, a signal selector can be used to select between an output signal and a bypass signal of an upstream device, depending on whether or not the device is powered on or powered off, for example. If the device is always powered on, then a signal selector downstream of that device may not be needed and hence can be eliminated. In other words, referring to FIG. 2A, if for example device 1 is always powered on, then selector 24 may be eliminated from the design of system 20.

For brevity, FIG. 2A is discussed for device 1. The discussion of FIG. 2A can be readily extended to device 2 as well as to other devices that may be present in system 20.

Coupled to device 1 is an input line 26 and an output line 28. Output line 28 is coupled to the selector 24. Bypass line 30 couples input line 26 to selector 24, bypassing device 1.

In the present embodiment, a power rail 22 for device 1 is also coupled to device 1 and selector 24. In this embodiment, device 1 is powered using power rail 22, while power rail 22 is coupled to a selection pin 25 of selector 24. Selector 24 receives power from standby power rail 32 or from some other stable source of power. Device 2 receives power from power rail 36.

Thus, in the present embodiment, device 1 and selector 24 are both coupled to the same power rail. Accordingly, selector 24 can readily detect whether device 1 is powered on or powered off. Significantly, because device 1 and selector 24 are coupled to the same power rail, selector 24 can be implemented without additional control logic.

System 20 is now described in operation for device 1. An input signal travels over input line 26 to device 1. If device 1 is powered on, the input signal is also delivered to selector 24 via output line 28. The input signal also travels over bypass line 30 to selector 24. Selector 24 will always receive the input signal via bypass line 30, although selector 24 may not always select the signal delivered over bypass line 30, as described below.

If device 1 is powered on, then power rail 22 is high, and this causes selector 24 to select signals from output line 28. If device 1 is powered off, then power rail 22 is low, and this causes selector 24 to select signals from bypass line 30. The selected signal (selector output 34) is forwarded to the next device in the scan chain (e.g., device 2).

Note that should device 1 become inoperable for some reason, then power to that device can be turned off. As a result, selector 24 will select signals from bypass line 30.

Thus, according to the embodiments of the present invention, the scan chain remains intact and testing can proceed when device 1 is powered off or is otherwise inoperable, without having to physically remove the device from the scan chain.

Note also that device 1 can be selectively removed from the scan chain by powering it off. There may be reasons why it is desirable to isolate a device from the scan chain, and the features of the present invention facilitate that effort, without having to physically remove the device from the scan chain.

Figure 2B:
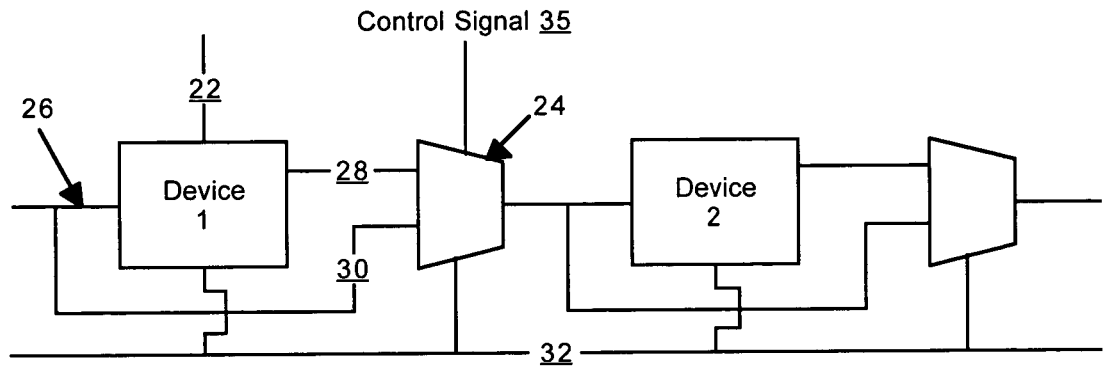
FIG. 2B is a block diagram of a system for testing devices according to another embodiment of the present invention.

FIG. 2B is a block diagram of a system for testing devices according to another embodiment of the present invention. One difference between the embodiment of FIG. 2B and the embodiment of FIG. 2A is the use of a control signal 35 provided over a control line coupled to selector 24. Under control of the control signal 35, selector 24 selects either the output of device 1 (the signal delivered over output line 28) or the bypass signal (the signal delivered over bypass line 30). Control signal 35 can be set in a number of different ways. Control signal 35 can be set independent of whether or not device 1 is powered on. Thus, even if device 1 is powered on and operable, device 1 can be isolated from the scan chain by selecting the bypass signal in response to the control signal 35.

Figure 3:
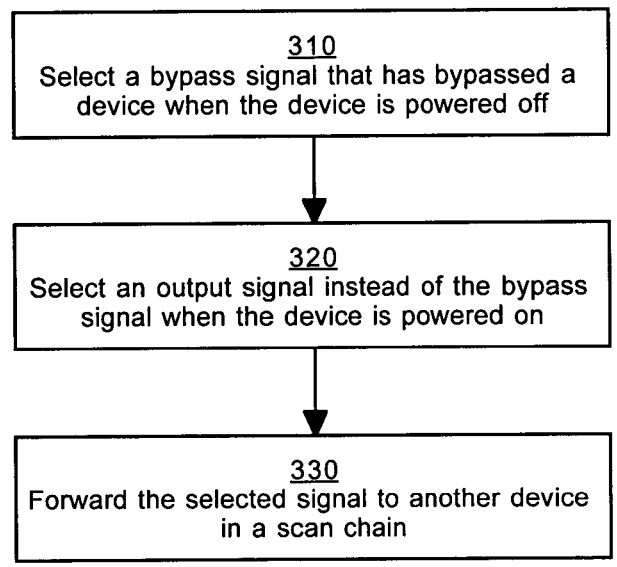
FIG. 3 is a flowchart of a method for testing devices according to one embodiment of the present invention.

FIG. 3 is a flowchart 300 of a method for testing devices according to one embodiment of the present invention. Although specific steps are disclosed in flowchart 300, such steps are exemplary. That is, embodiments of the present invention are well suited to performing various other steps or variations of the steps recited in flowchart 300. It is appreciated that the steps in flowchart 300 may be performed in an order different than presented.

In step 310, a signal selector (e.g., selector 24 of FIGS. 2A and 2B) selects a signal that has bypassed a device that is upstream of the signal selector (e.g., device 1 of FIGS. 2A and 2B). Specifically, the signal selector selects the signal delivered via bypass line 30 of FIGS. 2A and 2B. The upstream device may be powered off or otherwise inoperable, or the device may be powered on and operable. In either case, the upstream device is isolated from the scan chain while maintaining the integrity of the scan chain.

In step 320 of FIG. 3, the signal selector can instead select a signal that is an output of the upstream device. For example, when the upstream device is powered on or otherwise is operable, then the signal selector selects the signal delivered via output line 28 of FIGS. 2A and 2B.

In step 330 of FIG. 3, the selected signal is forwarded to the next device in the scan chain (e.g., device 2 of FIGS. 2A and 2B).

In summary, embodiments of the present invention provide methods and systems that allow scan chain testing when one or more of the devices in the scan chain are powered off or otherwise inoperable, or is selectively isolated from the scan chain. As a result, scan chain testing is facilitated and can be accomplished more quickly.

Although described for multiple devices coupled in a scan chain, the features of the present invention, in its various embodiments, can also be used to perform similar testing of components within a single device. That is, a device may include a number of internal devices that are coupled in series, and a signal selector can be situated between the internal devices and used during testing in a manner similar to that described above.

Embodiments of the present invention are thus described. While the present invention has been described in particular embodiments, it should be appreciated that the present invention should not be construed as limited by such embodiments, but rather construed according to the following claims.

What is claimed is:

1. A system for testing devices, said system comprising:
   a first device for test;
   a second device for test coupled to said first device in a scan chain;
   a signal selector coupled between said first and second devices, said signal selector for selecting between an output signal that is output from said first device and a bypass signal that has bypassed said first device; and a first power rail that supplies power to said first device and is coupled to said signal selector, wherein said signal selector selects said output signal when said first device is powered on and said bypass signal when said first device is not powered on.

2. The system of claim 1 wherein said signal selector is coupled to a standby power rail that powers said signal selector.

3. The system of claim 1 wherein said second device is coupled to a second power rail.

4. The system of claim 1 wherein said signal selector is a multiplexer.

5. The system of claim 1 wherein said first and second devices are boundary scan compliant devices.

6. A method of testing devices in a scan chain, said method comprising:
    selecting a bypass signal that has bypassed a first device;
    selecting an output signal instead of said bypass signal, said output signal being output from said first device, wherein said output signal is selected when power is detected in a first power rail coupled to said first device and wherein said bypass signal is selected when no power is detected in said first power rail; and
    forwarding a selected signal to a second device in said scan chain.

7. The method of claim 6 wherein said selecting between said bypass signal and said output signal is performed by a signal selector that is coupled to said first power rail.

8. The method of claim 7 wherein said signal selector is also coupled to a standby power rail.

9. The method of claim 6 wherein said first and second devices are boundary scan compliant devices.

10. A system for testing devices, said system comprising:
    a first device for test coupled in a scan chain, said first device coupled to a first power rail;
    an input line that delivers an input signal to said first device;
    an output line coupled to said first device;
    a signal selector coupled to said output line and also coupled to said first power rail; and
    a bypass line coupled to said input line upstream of said first device and to said signal selector such that said input signal is delivered to said signal selector even if said first device is powered off, wherein said signal selector selects between a signal on said output line and a signal on said bypass line, wherein said signal on said output line is selected when power is detected in said first power rail and said signal on said bypass line is selected when no power is detected in said first power rail.

11. The system of claim 10 wherein said signal selector is also coupled to a standby power rail that powers said signal selector.

12. The system of claim 10 further comprising: a second device for test coupled to said signal selector.

13. The system of claim 12 wherein said first device is coupled to one power rail and wherein said second device is coupled to a different power rail.

14. The system of claim 10 wherein said signal selector is a multiplexer.

15. The system of claim 10 wherein said first device is boundary scan compliant.

* * * * *